United States Patent [19]

Azuma

[11] Patent Number: 5,766,649
[45] Date of Patent: Jun. 16, 1998

[54] RESIN SEALING MOLD DIE SET WITH LESS RESIN REMAINDER FOR SEMICONDUCTOR DEVICE

[75] Inventor: Kousuke Azuma, Tokyo, Japan

[73] Assignee: NEC Corporation, Tokyo, Japan

[21] Appl. No.: 754,806

[22] Filed: Nov. 21, 1996

[30] Foreign Application Priority Data

Dec. 15, 1995 [JP] Japan ..................... 7-326970

[51] Int. Cl.⁶ .................... B29C 45/02; B29C 45/14; B29C 45/27
[52] U.S. Cl. .................... 425/116; 425/117; 425/544; 425/DIG. 228; 264/272.17; 264/328.12; 249/135
[58] Field of Search ................ 264/272.17, 328.12; 425/116, 117, 544, 572, 583, DIG. 228, 129.1; 249/116, 135

[56] References Cited

U.S. PATENT DOCUMENTS

| | | | |
|---|---|---|---|
| 4,641,418 | 2/1987 | Meddles | 264/272.17 |
| 5,197,183 | 3/1993 | Chia et al. | 264/272.17 |
| 5,635,220 | 6/1997 | Izumi et al. | 425/116 |

FOREIGN PATENT DOCUMENTS

| | | | |
|---|---|---|---|
| 56-43854 | 10/1981 | Japan | 264/272.17 |
| 2-9142 | 1/1990 | Japan | |
| 2-186647 | 7/1990 | Japan | 264/272.17 |
| 4-180664 | 6/1992 | Japan | |

*Primary Examiner*—Khanh P. Nguyen
*Attorney, Agent, or Firm*—Sughrue, Mion, Zinn, Macpeak & Seas, PLLC

[57] ABSTRACT

There is provided a mold die set for molding a package body which is composed of a lead frame and a semiconductor chip mounted on the lead frame, and the lead frame has a hole. The mold die set is composed of an upper mold die and a lower mold die and the package body being clamped by the upper mold die and the lower mold die. The lower mold die includes a runner section, a table section connected to the runner section and protruding from a bottom of the runner section, a lower concave section connected to the table section, and a lower gate disposed between the table section and the lower concave section. The upper mold die includes a resin reservoir section provided in a position corresponding to the table section such that the hole of the lead frame is positioned between the resin reservoir section and the table section, an upper concave section connected to the resin reservoir section such that the upper concave section and the lower concave section constitute a cavity section for molding the package body, and an upper gate provided between the resin reservoir section and the upper concave section.

13 Claims, 4 Drawing Sheets

RESIN SEALING MOLD DIE SET WITH LESS RESIN REMAINDER FOR SEMICONDUCTOR DEVICE

BACKGROUND OF THE INVENTION

1. Field of the Invention

The present invention relates to a mold die set for a semiconductor device, and more particularly to a mold die set for a resin sealing type semiconductor device which has the body structure in which a semiconductor chip is mounted on and wired to a lead frame.

2. Description of Related Art

In recent years, it is required that a resin sealing type semiconductor device is made in a thin package type such that it can be mounted on a printed circuit board with a high density. However, there are various problems to form such a thin package type semiconductor device. For instance, in a mold die set used to form the thin package type semiconductor device, because the gate for injecting molten resin into a cavity section in which a semiconductor chip is located is provided only on the side of a lower mold die as disclosed in Japanese Laid Open Patent Disclosure (Heisei 4-180664), the semiconductor chip is moved upwardly due to the injection pressure of the molten resin. As a result, there is a case that the semiconductor chip is sealed by the resin in an inclined state or a part of the structure body including the semiconductor chip is exposed from the package. Even when there is no exposed part, there is a case that internal wires are bent so that a short circuit is formed.

In order to solve the above-mentioned problems, various proposals have been made. FIG. 1 is a top plan view of the body structure composed of a lead frame 22 and a semiconductor chip after the body structure is molded using a conventional mold die set. FIG. 2 is a cross sectional view to illustrate the state in which the body structure is clamped by an upper mold die 12 and a lower mold die 13 in the mold die set. The body structure is located in a cavity section 11 formed by the upper mold die 12 and the lower mold die 13. The mold die set is disclosed in Japanese Laid Open Patent Disclosure (Heisei 2-9142). As shown in FIG. 2, in the mold die set, a resin reservoir section 15 is provided in the upper mold die 12 in addition to a gate 13b. Molten resin is supplied from a resin source to the resin reservoir section 15 via a runner section 17 and a hole 23 which is formed in the lead frame 22. The runner section 17 is provided on the side of the lower mold die 13. The resin reservoir section 15 temporarily stores the molten resin such that the molten resin can be continuously and smoothly injected into the cavity section 11 through the gate 13b of the upper mold die 12. In this manner, the upper and lower mold dies 12 and 13 are provided with the gates 13b and 13a such that the molten resin is injected along two arrow marks, respectively. Thereby, injection pressures of the molten resin acting on the upper and lower surfaces of the semiconductor chip 21 are equalized so that inclination of the semiconductor chip 21, formation of a short circuit between wires and bending of the lead frame 22 can be prevented.

FIGS. 3A and 3B are diagrams to explain the process for removing a resin remainder or resin remaining portion 24 from a package body 20 after the body structure of a semiconductor device is molded using the above-mentioned mold die set. As shown in FIG. 3A, when the body structure composed of the lead frame 22 and the semiconductor chip 21 mounted thereon is molded with the resin, the package body 20 formed by the cavity section 11 is connected to a runner section resin remaining portion 24 which is formed by a through-hole from the runner section 17 to the gate 13a in the lower mold die 13 and to a reservoir section resin remaining portion 25 which is formed by the resin reservoir section 15 of the upper mold die. When the resin sealing body thus formed is taken out from the mold die set 12 and 13, the runner section resin remaining portion 24 breaks at the gates 13a and comes off the package body 20, as shown in FIG. 3B. However, the reservoir section resin remaining portion 25 is left on lead frame 22 and in this state, the resin sealing body is sent to the following process.

For this reason, in the dam bar cutting process, the reservoir section resin remaining portion 25 of the resin sealing body is moved to a dam bar side of the lead frame 22. As a result, there is a problem that a punch of a cutting die collides against the reservoir section resin remaining portion 25 so that the punch is broken or a lead near to the resin remaining portion 25 is damaged.

From the above result, the inventor considered that the above-mentioned problem could be solved if the resin sealing body is molded such that the reservoir section resin remaining portion 25 does not move. Based on this consideration, the inventor modified the mold die set such that a part of the runner section resin remaining portion 24 as a resin remaining portion 26 is remained and adhered to the reservoir section resin remaining portion 25 so that the reservoir section resin remaining portion 25 is fixed. That is, as shown by a dot line in FIG. 2, a protrusion portion 16 is provided as a second gate at a position of the runner section 17 corresponding to the end portion of the resin reservoir section 15. In this manner, it is intended that the reservoir section resin remaining portion 25 is fixed by the resin remaining portion 26 to form a unified resin remaining portion.

However, the modified mold die set caused a new problem. When the resin sealing body is separated from the lower mold die, the separation of the resin remaining portion 26 which is formed in a hollow portion on the side of the gate 13a is bad. As a result, it is difficult to continuously perform the sealing process. In addition, in removing resin remaining in the hollow portion, the protrusion portion 16 becomes troublesome. Even if a removing tool of soft material such as brass is used so as not to flaw the polished surface of the runner section 17, a great deal of steps are spent in removing the remaining resin from the hollow portion in the lower mold die. Further, when the resin sealing body is separated from the lower mold die after the sealing process, there is a problem in that the runner section resin remaining portion 24 is not separated at a desired position so that a die used after the sealing process engages with the runner section resin remaining portion 24 and is damaged.

SUMMARY OF THE INVENTION

Therefore, the object of the present invention is to provide a resin sealing mold die set for a semiconductor device which can operate to continuously and stably perform the sealing process without producing any resin remaining portion which brings a defect to a die set in a subsequent process.

In order to achieve an aspect of the present invention, there is provided a mold die set for molding a package body which is composed of a lead frame and a semiconductor chip mounted on the lead frame, and the lead frame has a hole. The mold die set is composed of an upper mold die and a lower mold die and the package body being clamped by the upper mold die and the lower mold die. The lower mold die includes a runner section, a table section connected to the runner section and protruding from a bottom of the runner section, a lower concave section connected to the table section, and a lower gate disposed between the table section and the lower concave section. The upper mold die includes a resin reservoir section provided in a position corresponding to the table section such that the hole of the lead frame is positioned between the resin reservoir section and the table section, an upper concave section connected to the resin reservoir section such that the upper concave section and the lower concave section constitute a cavity section for molding the package body, and an upper gate provided between the resin reservoir section and the upper concave section.

In this case, it is desirable that a cross sectional area of a resin flow path between the lead frame and the table section is made smaller than a cross section of the runner section such that a flow rate of molten resin to the lower gate substantially equal to that of the molten resin to the upper gate. Also, it is desirable that the cross sectional area of a resin flow path between the lead frame and the table section is made substantially equal to or larger than a cross sectional area of an opening at the lower gate.

The length of the table section in a direction in which molten resin flows is longer than a length of the hole in the same direction and desirably is in a range of 1.8 mm to 2.0 mm.

For easy maintenance, it is desirable that the upper and lower mold dies are made of stainless steel and a surface of the resin reservoir section and a surface of the table section are subjected to hard chrome plating.

In order to achieve another aspect of the present invention, there is a mold die set for molding a package body which is composed of a lead frame and a semiconductor chip mounted on the lead frame, the lead frame having a hole. The mold die set is composed of an upper mold die and a lower mold die by which the package body is clamped. The lower mold die includes a runner section having a necking portion, a table section connected to the runner section via the necking portion and protruding from a bottom of the runner section, a lower concave section connected to the table section, and a lower gate disposed between the table section and the lower concave section. The upper mold die includes a resin reservoir section provided in a position corresponding to the table section such that the hole of the lead frame is positioned between the resin reservoir section and the table section, an upper concave section connected to the resin reservoir section such that the upper concave section and the lower concave section constitute a cavity section for molding the package body, and an upper gate provided between the resin reservoir section and the upper concave section.

In order to achieve still another aspect of the present invention, there is provided a mold die set for molding a package body which is composed of a lead frame and a semiconductor chip mounted on the lead frame, the lead frame having a hole. The mold die set is composed of an upper mold die and a lower mold die by which the package body is clamped. The lower mold die is composed of a runner section, a specific section connected to the runner section and provided in such a manner that molten resin in the specific section is hardened before the molten resin in the runner section is hardened, a lower concave section connected to the specific section, and a lower gate disposed between the specific section and the lower concave section. The upper mold die is composed of a resin reservoir section provided in a position corresponding to the specific section such that the hole of the lead frame is positioned between the resin reservoir section and the specific section, an upper concave section connected to the resin reservoir section such that the upper concave section and the lower concave section constitute a cavity section for molding the package body, and an upper gate provided between the resin reservoir section and the upper concave section.

DESCRIPTION OF THE PREFERRED EMBODIMENTS

Next, the mold die set of the present invention will be described below in detail with reference to the accompanying drawings.

Figure 1:
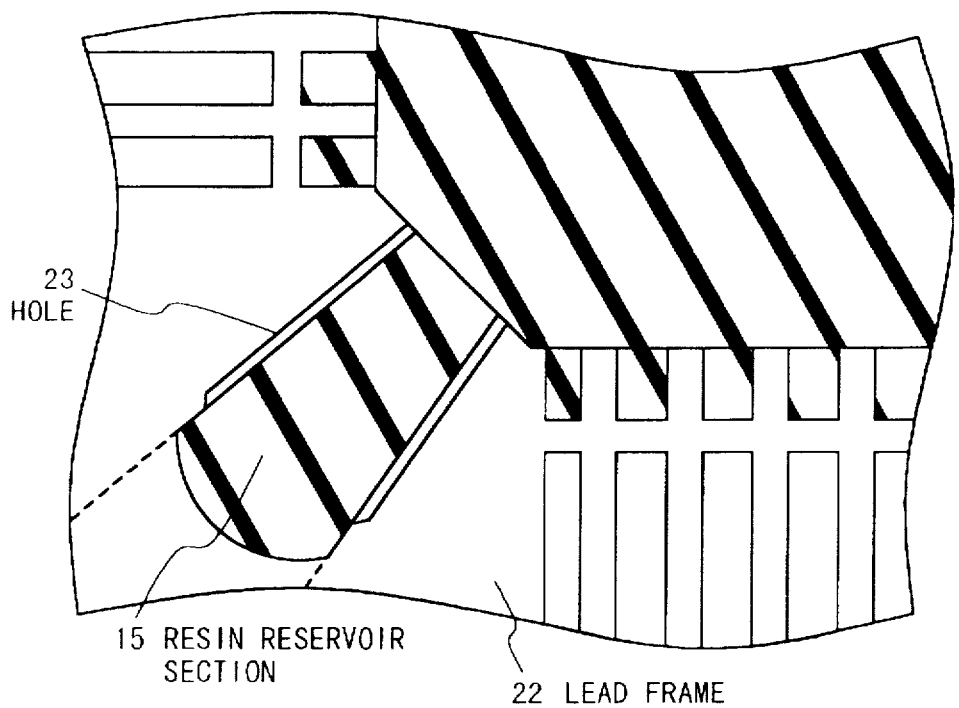
FIG. 1 is a partial top plan view of a resin sealing body of a semiconductor device after a structure body composed of a lead frame and a semiconductor chip mounted thereon is sealed using a conventional mold die set.
Figure 2:
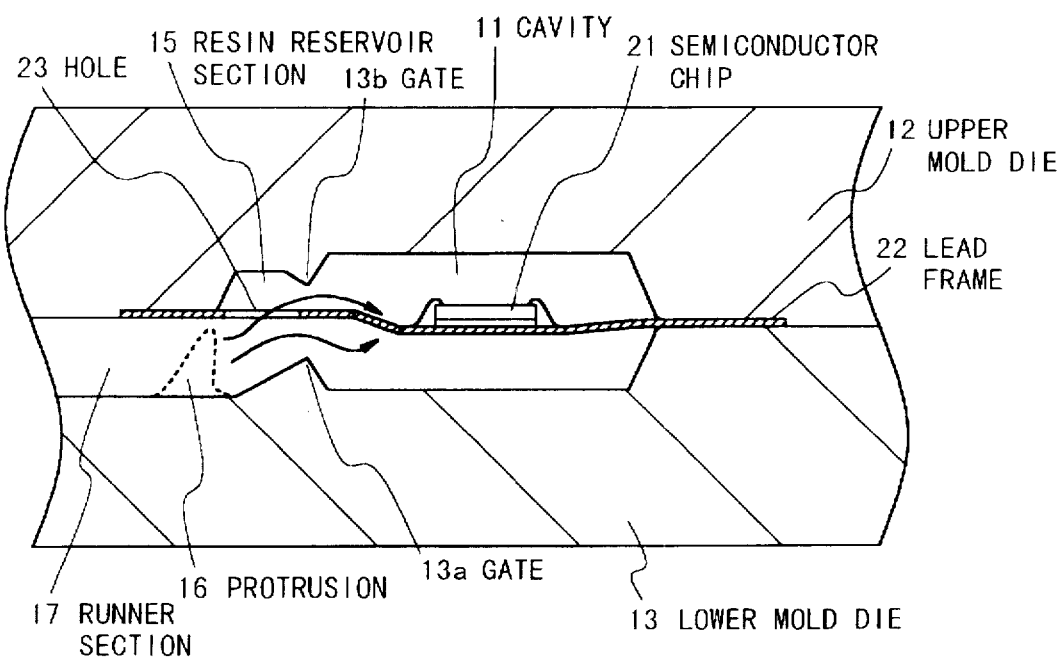
FIG. 2 is a cross sectional view of the conventional mold die set for manufacturing the resin sealing body of the semiconductor device shown in FIG. 1.
Figure 3A:
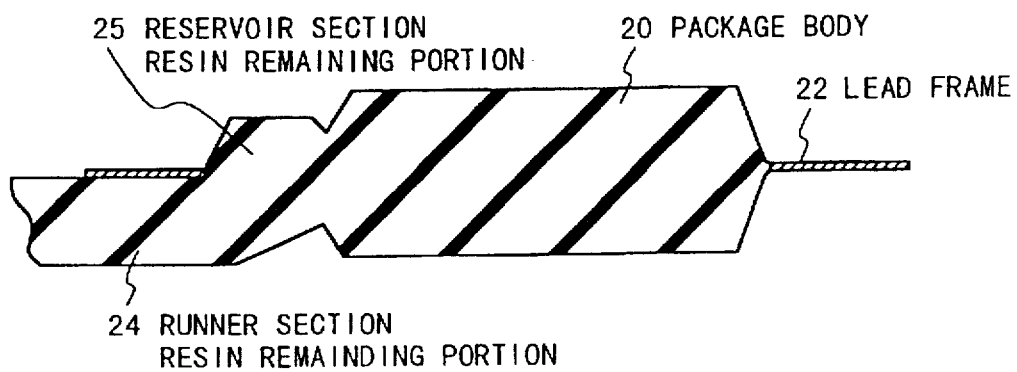
FIGS. 3A and 3B are diagrams to explain the process of removing a resin remaining portion of the resin sealing body of the semiconductor device after the resin sealing body is formed as shown in FIG. 1.
Figure 3B:
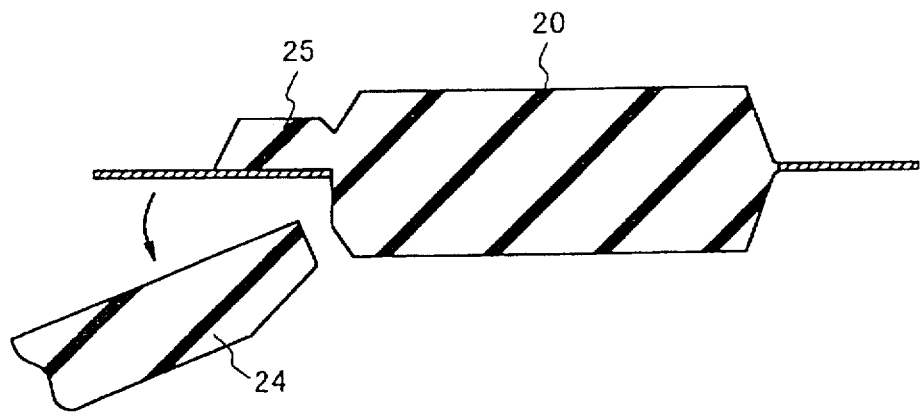
Figure 4:
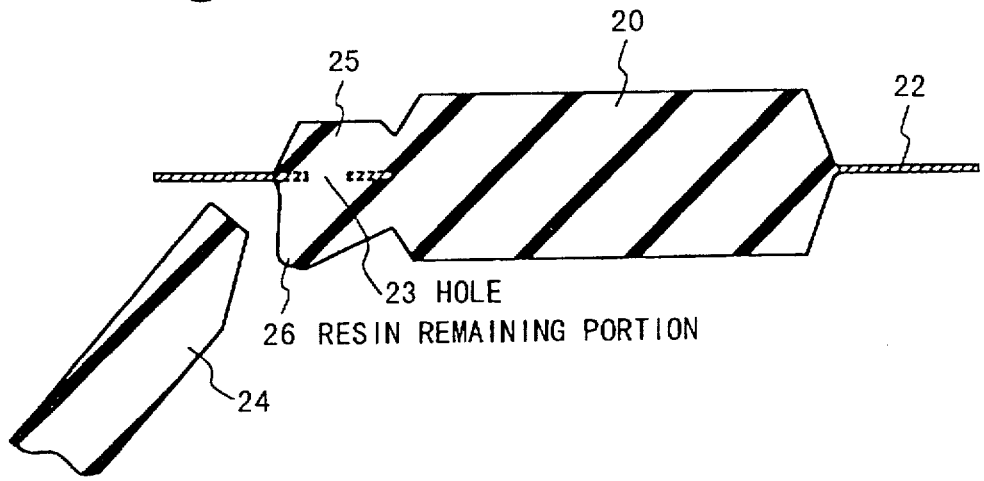
FIG. 4 is a diagram to explain the process of removing a resin remaining portion of the resin sealing body after the resin sealing body is formed using another mold die set in which a protrusion portion is provided in the lower mold die.
Figure 5:
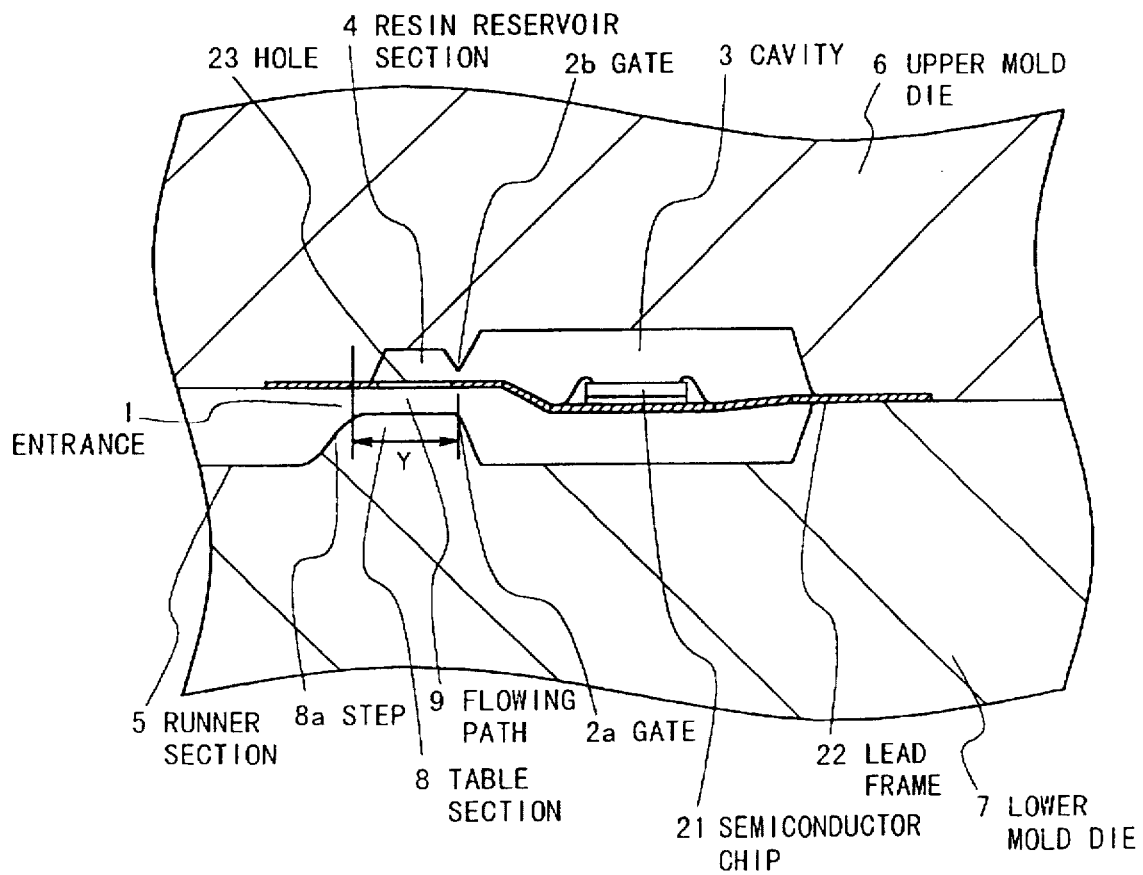
FIG. 5 is a cross sectional view of a mold die set according to a first embodiment of the present invention.
Figure 6:
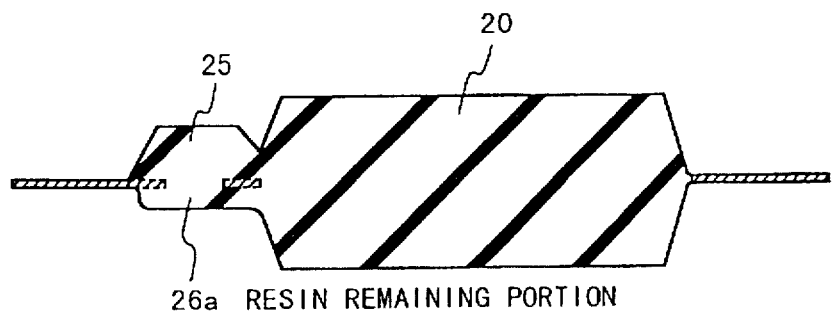
FIG. 6 is a diagram to explain the resin sealing body of a semiconductor device using the mold die set shown in FIG. 5.

First, the mold die set according to the first embodiment of the present invention will be described. FIG. 5 is a cross sectional view of a mold die set according to the first embodiment of the present invention and FIG. 6 is a diagram to explain the resin sealing body of a semiconductor device formed using the mold die set shown in FIG. 5.

Referring to FIG. 5, the mold die set is composed of an upper mold die 6 and a lower mold die 7. The lower mold die 7 is composed of a runner section 5, a table section 8 connected to the runner section 5, a gate 2a provided at the end portion of the table section 8 and a lower concave section extending from the gate 2a. The upper mold die 6 is composed of a resin reservoir section 4, a gate 2b provided at the end portion of the resin reservoir section 4 and an upper concave section extending from the gate 2b.

The resin reservoir section 4 is provided in the position corresponding to the table section 8 and the gate 2b is provided at the position substantially opposing to the gate 2a. A cavity section 3 for molding or sealing a lead frame 22 and a semiconductor chip 21 mounted thereon is composed of the upper concave section and the lower concave section. The table section protrudes upward from the bottom of the runner section 5 and connected to the runner section 5 via a step 8a. The table section has a flat surface and a length Y in a direction of flowing of the molten resin. As a result, a flowing path 9 above the table section 8 is narrowed in such a manner that the flowing rate of the molten resin to the gate 2a becomes equal to that of the molten resin to the gate 2b through a hole 23 provided for the lead frame 22 and the resin reservoir section 4. Of course, the entrance area 1 of this flowing path 9 is approximately equal to or slightly larger than that of the gate 2a for the molten resin to smoothly flow. By using the narrow flowing path 9, when the mold die set is opened to take out the resin sealing body, a small volume of resin is hardened faster than other sections such as the runner section 5 so that the runner section resin remaining portion can be broken in a position near to the entrance 1. In this case, it is desirable that the hard chrome plating is performed on the surfaces of the reservoir section 4 and table section 8 made of stainless steel, such that the resin sealing body can be easily separated from the mold die set 6 and 7.

The distance Y from the gate 2a to the entrance 1 needs to be slightly longer than the diameter of the hole 23 in a resin flowing direction such that the reservoir section resin remaining portion 25 can be fixed to the lead frame 22. However, if the distance Y is too long, the flowing path 9 acts as the resistance to the flow of the molten resin and there is a possibility of the occurrence of an air bubble and resin remaining portions and so on in the resin sealing body. Accordingly, it is desirable that the distance Y is approximately equal to the length of the resin reservoir section 4. Empirically, regardless of the size of the mold die set, the distance Y is desirable in a range of about 1.8 mm to 2 mm.

Next, the resin sealing operation of the semiconductor device by using this resin sealing mold die set will be described. First, a structure body which is composed of a lead frame 22 and a semiconductor chip 21 mounted on the lead frame 22 and connected to the lead frame by wirings is conveyed to the stage of the mold die set. At this time, the structure body is set on the lower mold die 7 such that the structure body is located on the concave section of the lower mold die 7. The upper mold die 6 and the lower mold die 7 are closed such that the lead frame 22 is clamped by the upper and lower mold dies 6 and 7.

Next, the meld resin is supplied from a resin source to the runner section 5. The molten resin rises up in the step section 8a and enters the lower concave section through the entrance 1, the table section 8 and the gate 2a. At the same time, the molten resin enters the upper concave section through the hole 23 of the lead frame 22, the resin reservoir section 4 and the gate 2b. In this case, because the flowing path 9 is narrow, the most of the molten resin flows into the resin reservoir section 4 through the hole 23 of the lead frame 22. Therefore, although there is delay in the flow of the molten resin for this reason, the injection pressures of the molten resin injected from the gates 2a and 2b are approximately equal to each other. As a result, the semiconductor chip 21 is kept in the stable state.

When the cavity section 3 is filled with the molten resin, gas which remains in the cavity section 3 is pressed out from bent portions (not shown) because of the molten resin pressure. After the resin is hardened, the mold die set is opened and the resin sealing body in which the semiconductor chip 21 is sealed is taken out from the mold die set 6 and 7. In this case, the runner section resin remaining portion is broken in a position near to the entrance 1 and taken out in a state shown in FIG. 6. The reservoir section resin remaining portion 25 and resin remaining portion 26a respectively corresponding to the gates 2b and 2a of a package body 20 are fixed to the lead frame 22 via the hole 23 of the lead frame 22 such that they are fixed in a rivet connection. The reservoir section resin remaining portion 25 fixed in this manner cannot be moved even by a dam bar die and then is cut together with the die pad support leads as well as the resin remaining portion 26. Further, because the table section 8 has a smooth surface as described above, even if a resin is remained on the surface of the table section 8 during the sealing process, the remained resin can be easily removed by a removing tool made of brass.

Figure 7:
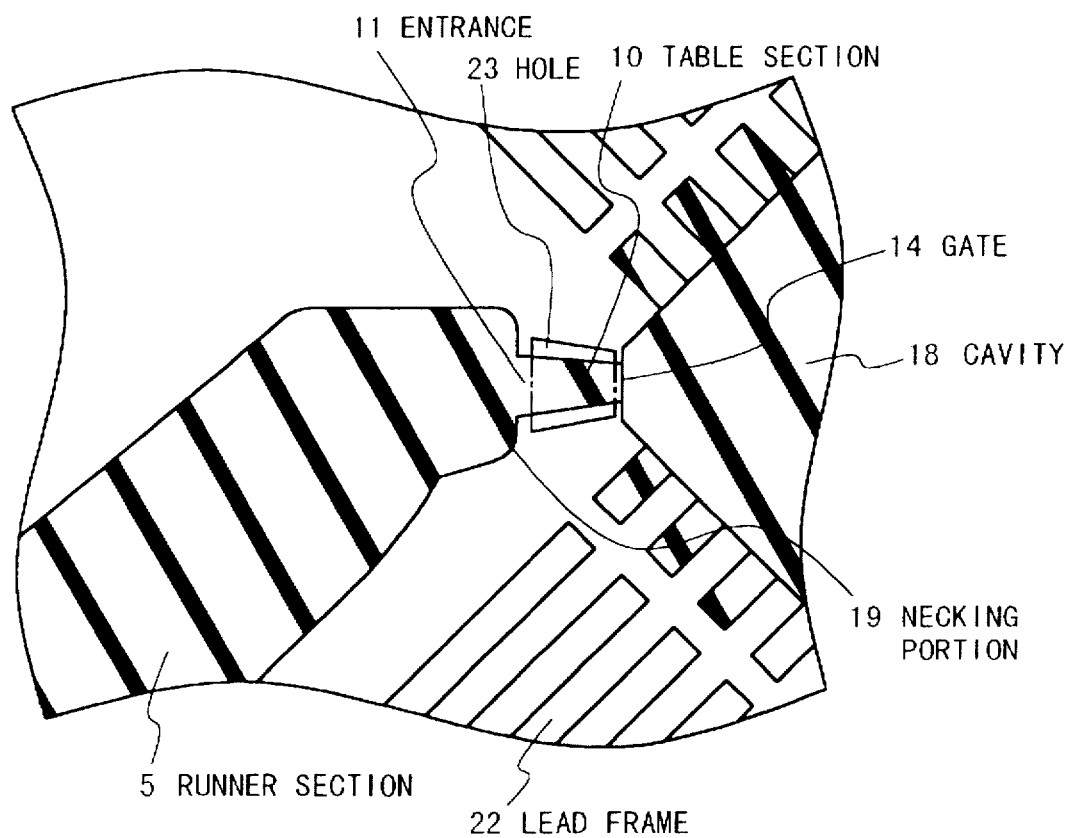
FIG. 7 is a partial bottom view of the resin sealing body of the semiconductor device using a mold die set according to a second embodiment of the present invention.

Next, the mold die set according to the second embodiment of the present invention will be described below. FIG. 7 is a partial bottom plan view of the resin sealing body sealed by the mold die set for the semiconductor device according to the second embodiment of the present invention. As shown in FIG. 7, for the purpose of narrowing in a lateral direction the table section 10 which is connected to the gates 14 via which the molten resin is injected into the cavity section 18 composed of the upper concave section in the upper mold die and the lower concave section in the lower mold die, there is provided a necking portion 19 between the table section 10 and the runner section 5. The relation of the length of the table section 10 and the gates 14 is the same as in the mold die set according to the first embodiment. The width of the table section 10 is narrowed. As a result, the height of the flowing path 9 above the table section 10 is higher than that of the mold die set in the first embodiment because the opening area in the entrance 11 is the same as in the mold die set in the first embodiment.

In the mold die set of the second embodiment, a notching effect due to the lateral necking portion 19 is further exhibited. Therefore, compared to the mold die set in the first embodiment, the distribution of lengths of the resin remaining potion 26a shown in FIG. 6 can be made smaller and falls within a range of 0.04 mm.

As described above, according to the present invention, the table section is provided opposite to the resin reservoir section which is provided to hold the molten resin supplied via the hole of the lead frame. The resin flowing path above the table section is longer than the hole of the lead frame and an opening area is substantially equal to or slightly larger than an opening area above the gate. In addition, there is further provided a necking portion, or the surfaces of the resin reservoir section and table section are subjected to surface treatment. Therefore, when the resin sealing body is taken out from the mold die set after the sealing process, the resin remained in the mold die set is less and can be easily removed. As a result, the sealing process can be continuously performed.

Further, the resin remaining portion by the resin reservoir section is fixed to the lead frame by the resin remaining portion formed on the table section as if the reservoir resin remaining portion is connected by a rivet. Therefore, because the reservoir resin remaining portion does not move in a dam bar cutting process and a carrying process, the resin remaining portion causes no defect in the processes subsequent to the sealing process.

What is claimed is:

1. A mold die set for molding a package body which is composed of a lead frame and a semiconductor chip mounted on said lead frame, said lead frame having a hole, said mold die set comprising an upper mold die and a lower mold die by which said package body is clamped, and wherein said lower mold die comprises:

a runner section;

a flat table section connected to said runner section and protruding from a bottom of said runner section;

a lower concave section connected to said flat table section; and a lower gate disposed between said flat table section and said lower concave section, and wherein said upper mold die comprises:

a resin reservoir section provided in a position corresponding to said flat table section such that said hole of said lead frame is positioned between said resin reservoir section and said flat table section;

an upper concave section connected to said resin reservoir section, and provided such that said upper concave section and said lower concave section constitute a cavity section for molding said package body; and an upper gate provided between said resin reservoir and said upper concave section.

2. A mold die set according to claim 1, wherein a cross sectional area of a resin flow path between said lead frame and said flat table section is made smaller than a cross section of said runner section such that a flow rate of molten resin to said lower gate is substantially equal to that of the molten resin to said upper gate through said hole of said lead frame and said resin reservoir section.

3. A mold die set according to claim 1, wherein a cross sectional area of a resin flow path between said lead frame and said flat table section is made substantially equal to or larger than a cross sectional area of an opening at said lower gate.

4. A mold die set according to claim 1, wherein a length of said flat table section in a direction in which molten resin flows is longer than a length of said hole in the same direction.

5. A mold die set according to claim 4, wherein said length of said flat table section in a direction in which molten resin flows is in a range of 1.8 mm to 2.0 mm.

6. A mold die set according to claim 1, wherein said upper and lower mold dies are made of stainless steel and a surface of said resin reservoir section and a surface of said flat table section are subjected to hard chrome plating.

7. A mold die set for molding a package body which is composed of a lead frame and a semiconductor chip mounted on said lead frame, said lead frame having a hole, said mold die set comprising an upper mold die and a lower mold die by which said package body is clamped, and wherein said lower mold die comprises:

a runner section;

a flat table section connected to said runner section via said necking portion and protruding from a bottom of said runner section; and a lower concave section connected to said flat table section; and a lower gate disposed between said flat table section and said lower concave section, and wherein said upper mold die comprises:

a resin reservoir section provided in a position corresponding to said flat table section such that said hole of said lead frame is positioned between said resin reservoir section and said flat table section;

an upper concave section connected to said resin reservoir section and provided such that said upper concave section and said lower concave section constitute a cavity section for molding said package body; and an upper gate provided between said resin reservoir and said upper concave section.

8. A mold die set according to claim 7, wherein a cross sectional area of a resin flow path between said lead frame and said flat table section is made smaller than a cross section of said runner section such that a flow rate of molten resin to said lower gate is substantially equal to that of the molten resin to said upper gate through said hole of said lead frame and said resin reservoir section.

9. A mold die set according to claim 7, wherein a cross sectional area of a resin flow path between said lead frame and said flat table section is made substantially equal to or larger than a cross sectional area of an opening at said lower gate.

10. A mold die set according to claim 7, wherein a length of said flat table section in a direction in which molten resin flows is longer than a length of said hole in the same direction.

11. A mold die set according to claim 10, wherein said length of said flat table section in a direction in which molten resin flows is in a range of 1.8 mm to 2.0 mm.

12. A mold die set according to claim 7, wherein said upper and lower mold dies are made of stainless steel and a surface of said resin reservoir section and a surface of said flat table section are subjected to hard chrome plating.

13. A mold die set according to claim 1, wherein said runner section has a necking section and said runner section is connected to said flat table section through said necking section.

* * * * *